(12) United States Patent
Nitsche et al.

(10) Patent No.: US 9,294,261 B2
(45) Date of Patent: Mar. 22, 2016

(54) SYSTEM AND METHOD FOR GENERATING AN ESSENTIALLY SINUSOIDAL SYNCHRONIZATION PULSE

(71) Applicant: ROBERT BOSCH GMBH, Stuttgart (DE)

(72) Inventors: Gerald Nitsche, Balingen (DE); Massoud Momeni, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/376,826

(22) PCT Filed: Jan. 21, 2013

(86) PCT No.: PCT/EP2013/051037
§ 371 (c)(1),
(2) Date: Aug. 5, 2014

(87) PCT Pub. No.: WO2013/117415
PCT Pub. Date: Aug. 15, 2013

(65) Prior Publication Data
US 2015/0030111 A1    Jan. 29, 2015

(30) Foreign Application Priority Data

Feb. 6, 2012    (DE) .......................... 10 2012 201 711

(51) Int. Cl.
*H04L 7/02* (2006.01)
*H04L 7/00* (2006.01)
(Continued)

(52) U.S. Cl.
CPC ............ *H04L 7/0079* (2013.01); *H04L 7/0091* (2013.01); *H04L 25/0286* (2013.01); *H04L 2007/047* (2013.01)

(58) Field of Classification Search
CPC . H04L 7/0079; H04L 7/0091; H04L 25/0286; H04L 2007/047
USPC ................ 375/295, 296, 316, 346, 347, 354; 345/89, 119; 340/438, 660; 330/127, 330/277, 297
See application file for complete search history.

(56) References Cited

U.S. PATENT DOCUMENTS 6,188,314 B1 *  2/2001  Wallace et al. ................ 340/438
6,484,223 B1 * 11/2002  Lenz ............................. 710/305
(Continued)

FOREIGN PATENT DOCUMENTS

DE    10 2009 001 370    9/2009
EP         0 728 621         8/1996
(Continued)

OTHER PUBLICATIONS

International Search Report, PCT International Application No. PCT/EP2013/051037, dated Apr. 25, 2013.

*Primary Examiner* — Dhaval Patel
(74) *Attorney, Agent, or Firm* — Kenyon & Kenyon LLP

(57) ABSTRACT

A reception system for a control unit in a vehicle having a voltage generator for generating a synchronization pulse which generates the synchronization pulse within predefined specification limits and having a predefined shape and a predefined time behavior, the reception system outputting the synchronization pulse for synchronizing a signal transmission via a data bus to at least one sensor, and a method for generating such a synchronization pulse. The voltage generator includes a voltage amplifier which generates the synchronization pulse generally as a sinusoidal oscillation based on a reference voltage.

6 Claims, 4 Drawing Sheets

(51) Int. Cl.
*H04L 25/02* (2006.01)
*H04L 7/04* (2006.01)

(56) References Cited

U.S. PATENT DOCUMENTS

| 7,248,646 B1* | 7/2007 | Efstathiou | 375/308 |
| 2012/0218031 A1* | 8/2012 | Bonsels et al. | 327/535 |

FOREIGN PATENT DOCUMENTS

| EP | 0 959 595 | 11/1999 |
| EP | 1 039 704 | 9/2000 |
| EP | 1 170 913 | 1/2002 |
| JP | S5783906 A | 5/1982 |
| JP | H 03-105968 | 5/1991 |
| JP | 2000286903 A | 10/2000 |
| JP | 2002123344 A | 4/2002 |

* cited by examiner

SYSTEM AND METHOD FOR GENERATING AN ESSENTIALLY SINUSOIDAL SYNCHRONIZATION PULSE

FIELD

The present invention is directed to a reception system for a control unit in a vehicle, and an associated method for generating a synchronization pulse.

BACKGROUND INFORMATION

Peripheral sensors for occupant protection systems mostly use current interfaces (for example, PAS4, PSI5) for transmitting sensor data to a central control unit (ECU) in a vehicle. The latest generation of current interfaces (PSI5) uses synchronization to allow bus operation with multiple sensors at a receiver. For the function of the synchronization, the central control unit (ECU) generates an operating cycle in the form of a voltage pulse which is detected by the sensors on the bus and indicates the start of a new data transmission cycle. This voltage pulse is referred to as a synchronization pulse and is generated with the aid of current sources and current sinks which charge and discharge the bus load. This voltage pulse is typically repeated every 500 μs.

In order for a synchronous bus system having one sensor or multiple sensors to function, it is important for the synchronization pulse to have a certain shape and a certain time behavior for all possible bus configurations and under all possible operating conditions. Therefore, known synchronous bus systems generally use a trapezoidal synchronization pulse $P_T$ having a predefined edge steepness, as shown in FIG. 3. The edge steepness lies between an edge steepness of a first characteristic curve, which represents a lower limit Vu, and an edge steepness of a second characteristic curve, which represents an upper limit Vo. During synchronous bus operation, the trapezoidal shape of synchronization pulse $P_T$ results in increased electromagnetic radiation (EMC) in the frequency spectrum of the signal transmission, due to the high harmonic content. This may be counteracted to a certain extent, for example, by a synchronization pulse $P_{Tr}$ shown in FIG. 4, which has a trapezoidal shape having four rounded vertices.

German Patent Application No. DE 10 2009 001 370 A1 describes a reception device for receiving current signals, a circuit system having such a reception device, and a method for transmitting current signals via a bus system. The described reception device includes at least two bus connecting devices for receiving current signals of multiple transmitters, each bus connecting device being designed for connecting to at least one bus connection, and a control device for outputting synchronization pulses to the bus connecting devices for synchronizing the transmitters. The bus connecting devices output the synchronization pulses with at least one time offset with respect to each other to the multiple transmitters, each of the synchronization pulses having a trapezoidal shape having rounded vertices.

SUMMARY

An example reception system according to the present invention for a control unit in a vehicle and an example method according to the present invention for generating a synchronization pulse may have the advantage that a preferably low electromagnetic radiation may be achieved via the sinusoidal form of the synchronization pulse within the predefined limits, in particular in the spectral range of the signal transmission (100 kHz to 300 kHz).

The present invention relates to not only rounding the vertices of the synchronization pulse, but also to optimize the entire shape in such a way that the electromagnetic radiation preferably remains limited to the range of the fundamental waves of the synchronization pulse.

Specific embodiments of the present invention provide a reception system for a control unit in a vehicle having a voltage generator for generating a synchronization pulse which generates the synchronization pulse within predefined specification limits and having a predefined shape and a predefined time behavior. The reception system outputs the synchronization pulse for synchronizing a signal transmission via a data bus to at least one sensor. According to the present invention, the voltage generator includes a voltage amplifier which generates the synchronization pulse generally as a sinusoidal oscillation based on a reference voltage.

In addition, a method is provided for generating a synchronization pulse for synchronizing a subsequent signal transmission between a reception system and at least one sensor via a data bus in a vehicle. The synchronization pulse is generated within predefined specification limits and has a predefined shape and a predefined time behavior and is transmitted by the reception system to the at least one sensor. According to the present invention, the synchronization pulse is generated generally as a sinusoidal oscillation based on a reference voltage.

The synchronization pulse may preferably be transmitted by the reception system to the at least one sensor prior to or at the start of the signal transmission between the at least one sensor and the receiver system.

It may be particularly advantageous if the voltage generator includes a digital control circuit and a digital-analog converter which generate the generally sinusoidal reference voltage and output it to the voltage amplifier.

In one advantageous embodiment of the reception system according to the present invention, a first voltage supply may provide a supply voltage for the voltage amplifier. In addition, a second voltage supply may provide supply voltages for the digital control circuit, the digital-analog converter, and for at least one additional circuit which is connectable to the data bus. For outputting the synchronization pulse, for example, a first switching unit may disconnect the at least one circuit from the data bus, and a second switching unit may connect the voltage amplifier to the data bus. The first and second switching units may, for example, be implemented as toggle switches. This advantageously enables a highly robust implementation of the synchronization pulse and reduced electromagnetic radiation. In addition, the control of the voltage amplifier may be completely transferred into the digital portion of the circuit, which may result in a space-efficient approach due to the ever advancing scaling of the semiconductor technology. The at least one additional circuit of the receiver system may be decoupled from the data bus during the synchronization pulse while the voltage generator is activated and coupled to the data bus for generating the synchronization pulse.

In one additional advantageous embodiment of the reception system according to the present invention, a shared voltage supply may provide a supply voltage for the voltage amplifier, the digital control circuit, and the digital-analog converter. In addition, the voltage amplifier may provide the supply voltage for at least one additional circuit which is connected to the data bus. By combining the two separate voltage supplies and omitting the two switching units, the complexity of the architecture of the reception system may be advantageously reduced, and the bus voltage may be assumed by the synchronization pulse without undershooting or discontinuities. The advantages of this embodiment of the present invention include on the one hand a space-efficient circuit and on the other hand a constant or continuous transition between the normal bus voltage and the synchronization voltage during the period of the synchronization pulse. In particular, the omission of the switching units means major savings in layout area and silicon area.

In one advantageous embodiment of the reception system according to the present invention, the supply voltage of the voltage amplifier may be predefined to be higher than a maximum amplitude of the synchronization pulse. This means that the voltage amplifier may be operated at a voltage which is higher than the maximum amplitude of the synchronization pulse. The output voltage of the voltage amplifier follows the shape of the reference voltage from the digital-analog converter. One characteristic of the amplifier is a high driving capability having correspondingly dimensioned output stages. This means that the voltage amplifier and the output stages are capable of providing or accepting a current which is sufficiently high in order to enable the desired shape of the synchronization pulse without signal breaks and signal distortions.

In one additional advantageous embodiment of the reception system according to the present invention, the digital control circuit may store and/or calculate the predefined shape and the predefined time behavior of the synchronization pulse, the digital control circuit being able to output corresponding digital data words to the digital-analog converter. The digital-analog converter generates a reference voltage from the N-bit data word, which is fed to the voltage amplifier. The resolution of the data word may be chosen for radiation-related reasons in such a way that the synchronization pulse may be mapped without significant jumps.

Exemplary embodiments of the present invention are illustrated in the figures and are described in greater detail in the description below. In the figures, identical reference numerals refer to components or elements which carry out identical or similar functions.

DETAILED DESCRIPTION OF EXAMPLE EMBODIMENTS

Figure 1:
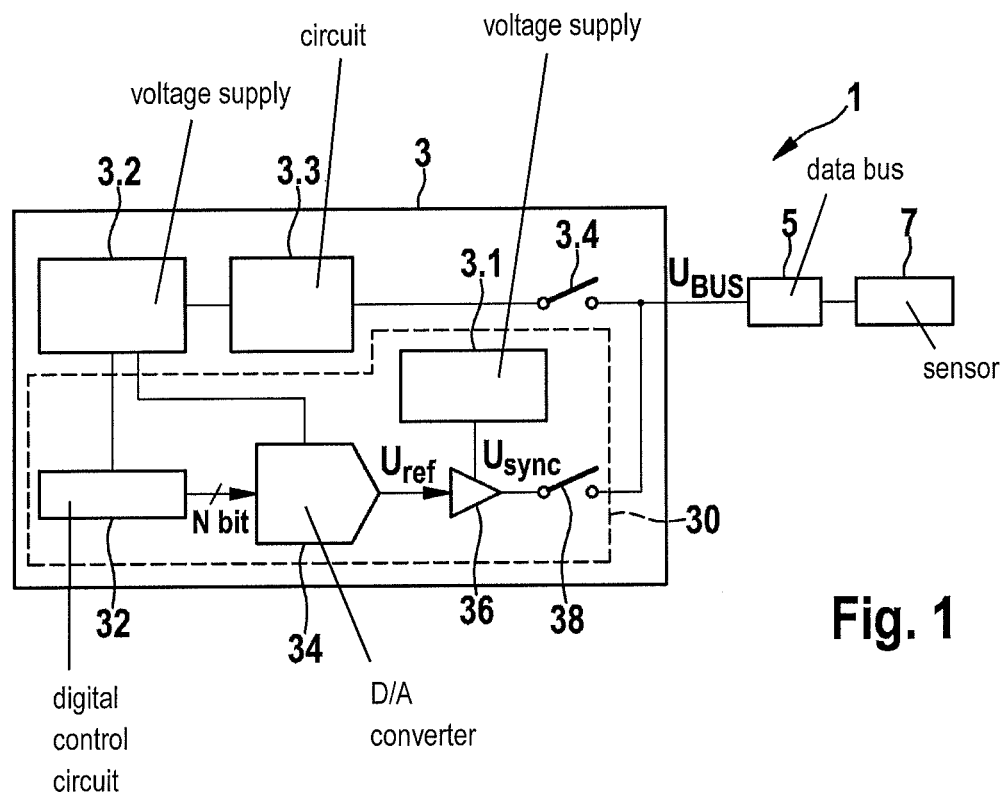
FIG. 1 shows a schematic block diagram of a sensor system in a first exemplary embodiment of a receiver system according to the present invention for a control unit in a vehicle, the receiver system generating and outputting an optimized synchronization pulse.
Figure 2:
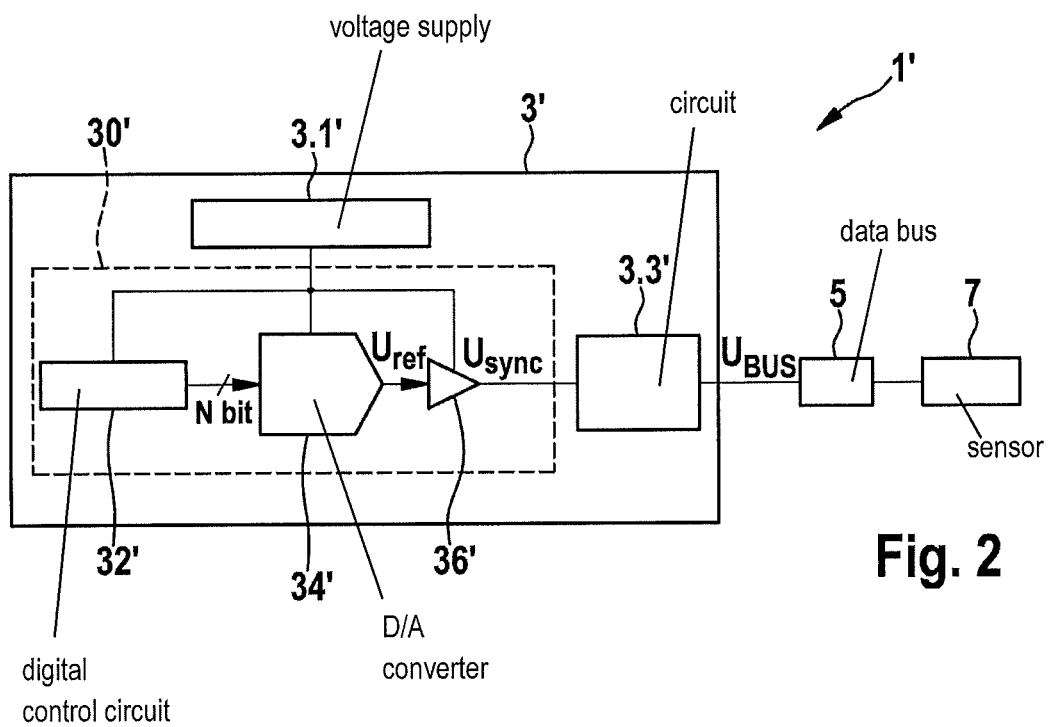
FIG. 2 shows a schematic block diagram of a sensor system in a second exemplary embodiment of a receiver system according to the present invention for a control unit in a vehicle, the receiver system generating and outputting an optimized synchronization pulse.
Figure 3:
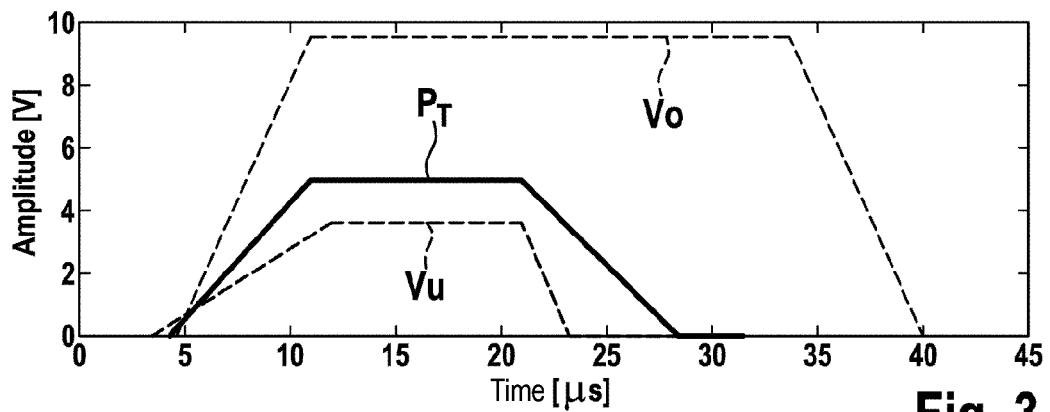
FIG. 3 shows a schematic representation of the shape and the time behavior of a conventional trapezoidal synchronization pulse within predefined limits.
Figure 4:
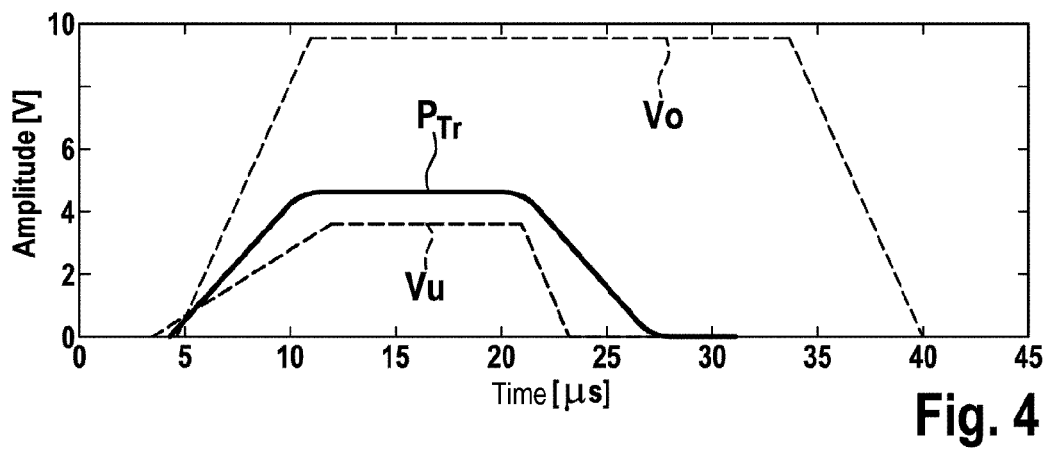
FIG. 4 shows a schematic representation of the shape and the time behavior of a conventional rounded trapezoidal synchronization pulse within the predefined limits.

As is apparent from FIGS. 1 and 2, illustrated sensor systems 1, 1' include a data bus 5, at least one sensor 7, and one exemplary embodiment each of a reception system 3, 3' according to the present invention for a control unit in a vehicle. Reception systems 3, 3' according to the present invention each include a voltage generator 30, 30' for generating a synchronization pulse $P_{sync}$. According to an example embodiment of the present invention, voltage generator 30, 30' includes a voltage amplifier 36, 36' which generates synchronization pulse $P_{sync}$ generally as a sinusoidal oscillation based on a reference voltage $U_{ref}$.

Figure 5:
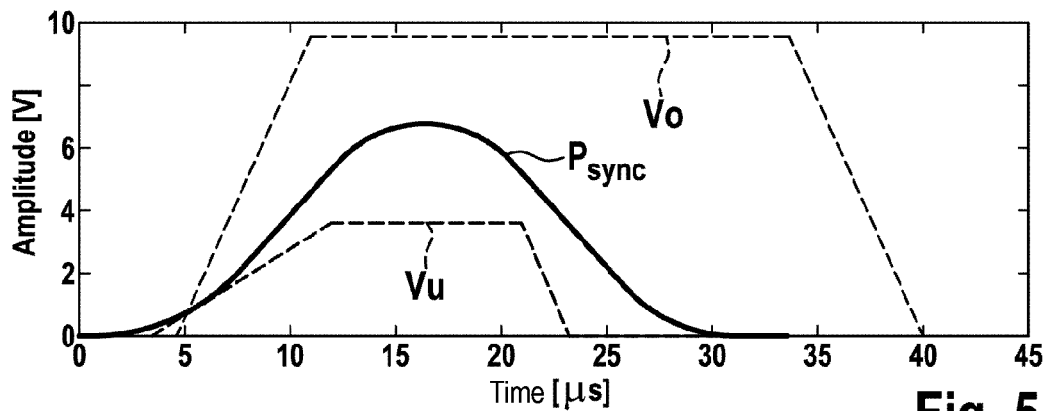
FIG. 5 shows a schematic representation of the shape and the time behavior of an optimized synchronization pulse according to the present invention within the predefined limits.

As is apparent from FIG. 5, voltage generator 30, 30' generates synchronization pulse $P_{sync}$ within predefined specification limits Vo, Vu having a predefined shape and a predefined time behavior. Reception system 3, 3' outputs synchronization pulse $P_{sync}$ for synchronizing a subsequent signal transmission via a data bus 5 to at least one sensor 7. In order for a synchronous bus system having one sensor 7 or multiple sensors to function, illustrated synchronization pulse $P_{sync}$ has a certain shape and a certain time behavior for all possible bus configurations and under all possible operating conditions. As is also apparent from FIG. 5, synchronization pulse $P_{sync}$ has an edge steepness which is predefined by the edge steepness of a first characteristic curve, which represents the lower limit Vu, and the edge steepness of a second characteristic curve, which represents the upper limit Vo. Synchronization pulse $P_{sync}$ is optimized within predefined limits Vu, Vo by the sinusoidal shape or the sinusoid-like shape in such a way that a preferably low electromagnetic radiation may be achieved, in particular, in the spectral range of the signal transmission (100 kHz to 300 kHz), which remains limited to the range of the fundamental waves of the synchronization pulse $P_{sync}$.

Figure 6:
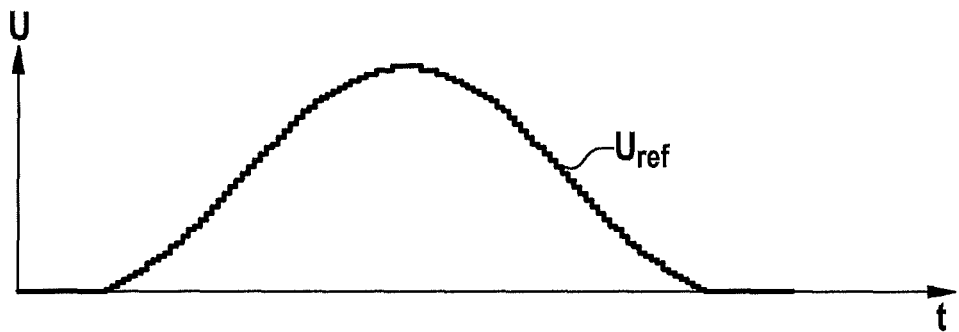
FIG. 6 shows a schematic representation of a reference voltage during an optimized synchronization pulse according to the present invention.
Figure 7:
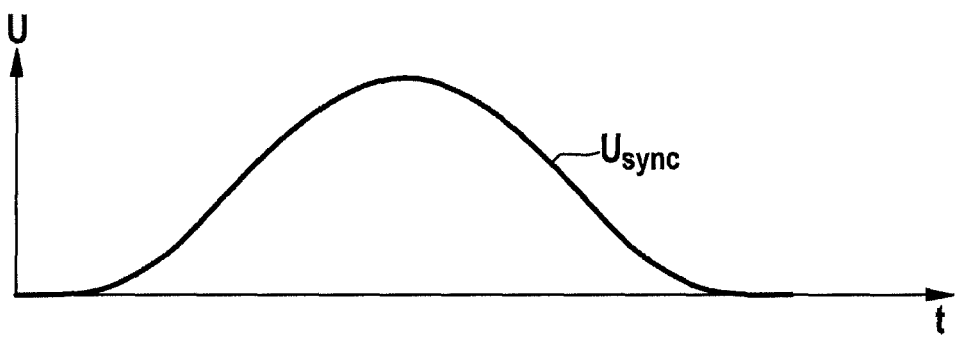
FIG. 7 shows a schematic representation of an output voltage of the voltage generator during an optimized synchronization pulse according to the present invention.

As is also apparent from FIGS. 1 and 2, voltage generator 30, 30' includes a digital control circuit 32, 32' and at least one digital-analog converter 34, 34', which generate an generally sinusoidal reference voltage $U_{ref}$ and output it to voltage amplifier 36, 36'. Such a sinusoidal reference voltage $U_{ref}$ is depicted in FIG. 6 by way of example. The quantization of reference voltage $U_{ref}$ based on the finite resolution of digital-analog converter 34, 34' is depicted schematically. FIG. 7 shows the corresponding output voltage $U_{sync}$ of voltage amplifier 36, 36'. The illustrated exemplary embodiments enable a highly robust implementation of synchronization pulse $P_{sync}$ and reduced electromagnetic radiation. In addition, the control of the voltage amplifier 36, 36' for generating synchronization pulse $P_{sync}$ may be completely transferred into the digital portion of reception system 3, 3', resulting in a space-efficient solution due to the ever advancing scaling of the semiconductor technology.

As is also apparent from FIG. 1, the illustrated first exemplary embodiment of reception system 3 according to the present invention includes a first voltage generator 30 having a first digital control circuit 32 and a first digital-analog converter 34, which generate the generally sinusoidal reference voltage $U_{ref}$ and output it to a first voltage amplifier 36. As is also apparent from FIG. 1, a first voltage supply 3.1 provides a supply voltage for first voltage amplifier 36, and a second voltage supply 3.2 provides supply voltages for first digital control circuit 32, first digital-analog converter 34, and for at least one additional circuit 3.3, which may be connected to data bus 5 via a first switching unit 3.4. For outputting synchronization pulse $P_{sync}$, first switching unit 3.4 disconnects the at least one additional circuit 3.3 from data bus 5, and a second switching unit 38 connects voltage amplifier 36 to data bus 5. The shape of synchronization pulse $P_{sync}$ is stored either in the digital portion or in first digital control circuit 32 or is calculated in the digital portion or in first digital control circuit 32 with the aid of an algorithm. First digital-analog converter 34 generates a reference voltage from the N-bit data word, which is fed to first voltage amplifier 36. The resolution of the data word is chosen for radiation-related reasons in such a way that synchronization pulse $P_{sync}$ is able to be mapped without significant jumps. First voltage amplifier 36 is supplied with a voltage which is greater than the maximum depicted amplitude of synchronization pulse $P_{sync}$, and its output voltage $U_{sync}$ follows the shape of reference voltage $U_{ref}$ from first digital-analog converter 34. One characteristic of first voltage amplifier 36 is a high driving capability having correspondingly dimensioned output stages. This means that voltage amplifier 36 and the output stages are capable of providing or accepting a current which is sufficiently high in order to enable the desired shape of synchronization pulse $P_{sync}$ without signal breaks and signal distortions.

As is also apparent from FIG. 2, the illustrated second exemplary embodiment of reception system 3' according to the present invention includes a second voltage generator 30' having a second digital control circuit 32' and a second digital-analog converter 34', which generate generally sinusoidal reference voltage $U_{ref}$ and output it to a second voltage amplifier 36'. As is also apparent from FIG. 2, unlike the first exemplary embodiment, a shared voltage supply 3.1' provides supply voltages for second digital control circuit 32', second digital-analog converter 34', and for second voltage amplifier 36'. In addition, second voltage amplifier 36' provides the supply voltage for at least one additional circuit 3.3', which is connected to data bus 5. Output voltage $U_{sync}$ of second voltage amplifier 36' is thus used as the voltage supply for at least one additional circuit 3.3' of reception system 3'. Therefore, one of the two voltage supplies 3.1, 3.2 in the first exemplary embodiment according to FIG. 1 may be omitted. The at least one additional circuit 3.3' of reception system 3' is thus not decoupled from data bus 5 during synchronization pulse $P_{sync}$. Therefore, both switching units 3.4, 38 in FIG. 1 may be dispensed with. The omission of switching units 3.4, 38 advantageously does not result in voltage jumps due to the transfer of bus voltage $U_{Bus}$ from second voltage generator 30' at transfer points UP, which are described below with reference to FIGS. 8 and 9.

Figure 8:
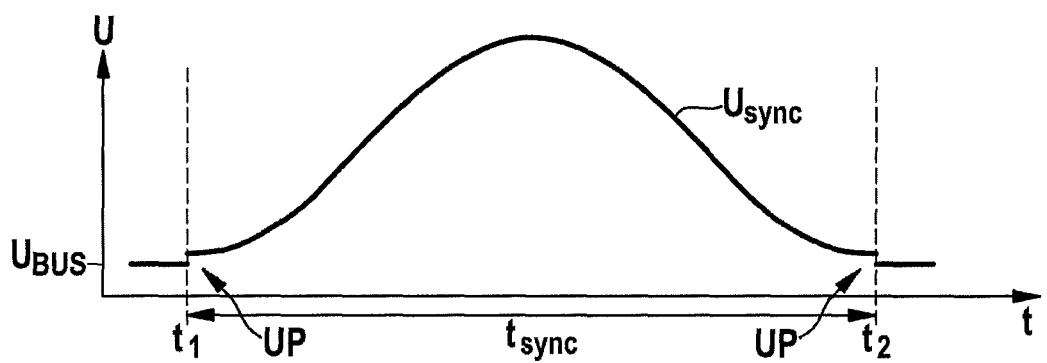
FIGS. 8 through 10 each show a schematic representation of the bus voltage during an optimized synchronization pulse according to the present invention.
Figure 9:
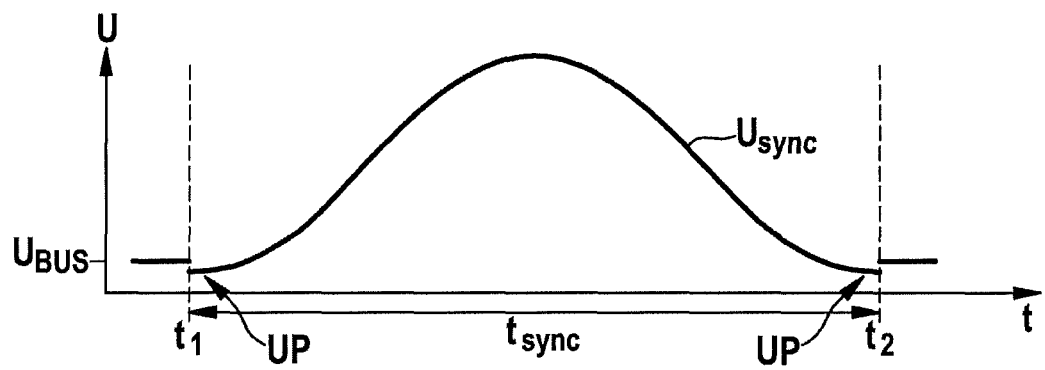

FIGS. 8 and 9 show by way of example the effects which may result from an incorrect transfer of bus voltage $U_{Bus}$ if switching operations are carried out. In the first exemplary embodiment according to FIG. 1, instantaneous bus voltage $U_{Bus}$ is provided by second voltage supply 3.2 of reception system 3 up to starting point in time $t_1$. During synchronization period $t_{sync}$, first voltage amplifier 36 provides output voltage $U_{sync}$ to data bus 5.

In the illustration in FIG. 8, when generating synchronization pulse $P_{sync}$, first voltage generator 30' initially assumes a starting voltage which is too high so that an upward voltage jump from normal bus voltage $U_{Bus}$ to the value of synchronization voltage $U_{sync}$ provided by first voltage amplifier 36 may result at transfer point UP at point in time $t_1$. At the end of synchronization pulse $P_{sync}$ at point in time $t_2$, the voltage at transfer point UP again jumps downward to normal bus voltage $U_{Bus}$.

In the illustration in FIG. 9, when generating synchronization pulse $P_{sync}$, first voltage generator 30' initially assumes a starting voltage which is too low so that a downward voltage jump from normal bus voltage $U_{Bus}$ to the value of synchronization voltage $U_{sync}$ provided by first voltage amplifier 36 may result at transfer point UP at point in time $t_1$. At the end of synchronization pulse $P_{sync}$ at point in time $t_2$, the voltage at transfer point UP again jumps upward to normal bus voltage $U_{Bus}$.

Figure 10:
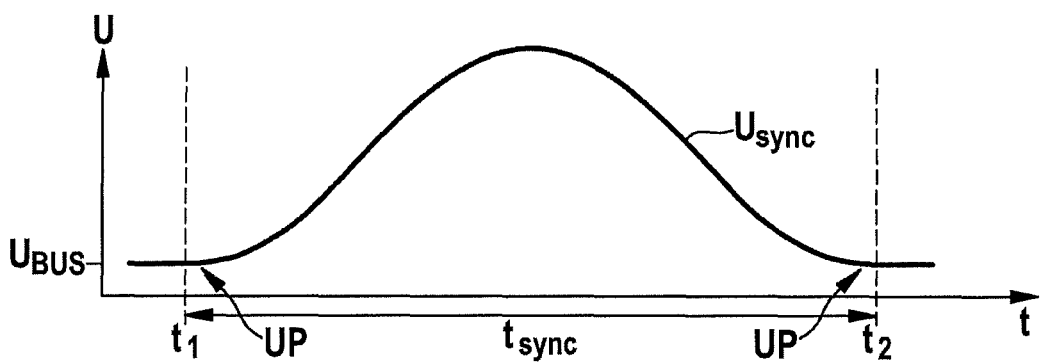

FIG. 10 shows synchronization pulse $P_{sync}$ generated by the second exemplary embodiment of reception system 3' according to the present invention in FIG. 2. By combining the two separate voltage supplies into a shared voltage supply 3.1' and omitting the two switching units 3.4, 38, normal bus voltage $U_{Bus}$ is able to switch to output voltage $U_{sync}$ of second voltage amplifier 36' without undershooting or discontinuities, and vice-versa. As is apparent from FIG. 10, at transfer point UP at point in time $t_1$, normal bus voltage $U_{Bus}$ switches continuously to the value of synchronization voltage $U_{sync}$ provided by second voltage amplifier 36. At the end of synchronization pulse $P_{sync}$ at point in time $t_2$, the voltage at transfer point UP likewise switches continuously again from the value of synchronization voltage $U_{sync}$ provided by second voltage amplifier 36 to normal bus voltage $U_{Bus}$.

Likewise, in the second exemplary embodiment of reception system 3', the shape of synchronization pulse $P_{sync}$ is stored either in the digital portion or in first digital control circuit 32 or is calculated in the digital portion or in first digital control circuit 32 with the aid of an algorithm. Second digital-analog converter 34' generates a reference voltage $U_{ref}$ from the N-bit data word, which is fed to second voltage amplifier 36'. The resolution of the data word is chosen for radiation-related reasons in such a way that synchronization pulse $P_{sync}$ is able to be mapped without significant jumps. Second voltage amplifier 36' is also supplied with a voltage which is greater than the maximum depicted amplitude of synchronization pulse $P_{sync}$, and its output voltage $U_{sync}$ follows the shape of reference voltage $U_{ref}$ from second digital-analog converter 34. One important characteristic of second voltage amplifier 36' is a high driving capability having correspondingly dimensioned output stages. This means that second voltage amplifier 36' and the corresponding output stages are also capable of providing or accepting a current which is sufficiently high in order to enable the desired shape of synchronization pulse $P_{sync}$ without signal breaks and signal distortions.

Specific embodiments of the method according to the present invention for generating a synchronization pulse $P_{sync}$ for synchronizing a subsequent signal transmission between reception system 3, 3' and at least one sensor 7 via a data bus 5 in a vehicle generate synchronization pulse $P_{sync}$ within predefined specification limits Vo, Vu having a predefined shape and a predefined time behavior. At the start of the signal transmission between the at least one sensor 7 and receiver system 3, 3', synchronization pulse $P_{sync}$ is transmitted to the at least one sensor 7 by receiver system 3, 3'. According to the present invention, synchronization pulse $P_{sync}$ is generated generally as a sinusoidal oscillation based on a reference voltage $U_{ref}$.

What is claimed is:

1. A reception system for a control unit in a vehicle, including:
a voltage generator that generates a synchronization pulse within predefined specification limits and having a predefined shape and a predefined time behavior, wherein:
the voltage generator includes a digital control circuit, a digital-analog converter and a voltage amplifier;

the reception system outputs the synchronization pulse to synchronize a signal transmission via a data bus to at least one sensor, the digital control circuit and the digital-analog converter generate a reference voltage, and the voltage amplifier generates the synchronization pulse as a sinusoidal oscillation based on the reference voltage; and a shared voltage supply that provides a supply voltage shared by the digital control circuit, the digital-analog converter and the voltage amplifier.

2. The reception system as recited in claim 1, wherein the digital control circuit and the digital-analog converter generate the reference voltage as a sinusoidal oscillation and output the reference voltage to the voltage amplifier.

3. The reception system as recited in claim 1, wherein the synchronization pulse generated by the voltage amplifier provides a supply voltage for at least one additional circuit which is connected to the data bus.

4. The reception system as recited in claim 1, wherein the supply voltage is higher than a maximum amplitude of the synchronization pulse.

5. The reception system as recited in claim 4, wherein the digital control circuit at least one of stores and calculates, the predefined shape and the predefined time behavior of the synchronization pulse, and wherein the digital control circuit outputs corresponding digital data words to the digital-analog converter.

6. A method for generating a synchronization pulse for synchronizing a subsequent signal transmission between a reception system and at least one sensor via a data bus in a vehicle, the method comprising:

generating a reference voltage using a digital control circuit and a digital-analog converter;

generating the synchronization pulse within predefined specification limits and to have a predefined shape and a predefined time behavior; and transmitting the synchronization pulse, by the reception system, to the at least one sensor;

wherein the synchronization pulse is generated by a voltage amplifier as a sinusoidal oscillation based on the reference voltage; and wherein a shared voltage supply provides a supply voltage shared by the digital control circuit, the digital-analog converter and the voltage amplifier.

\* \* \* \* \*